United States Patent [19]

Latta, Jr.

[11] Patent Number: 4,638,144

[45] Date of Patent: Jan. 20, 1987

[54] INDEXING LASER MARKER

[75] Inventor: William A. Latta, Jr., Linesville, Pa.

[73] Assignee: Automated Industrial Systems, Erie, Pa.

[21] Appl. No.: 726,706

[22] Filed: Apr. 24, 1985

[51] Int. Cl.$^4$ ............................................. B23K 26/00
[52] U.S. Cl. ........................ 219/121 LH; 219/121 LY
[58] Field of Search ................ 219/121 LH, 121 LJ, 219/121 EJ, 121 EK, 121 LY, 121 EX, 121 EY

[56] References Cited

U.S. PATENT DOCUMENTS

| | | | |
|---|---|---|---|
| 3,020,389 | 2/1962 | Gorman | 219/121 EX |
| 3,093,726 | 6/1963 | Burton, Jr. et al. | 219/121 EX |
| 3,440,392 | 4/1969 | Erlandson et al. | 219/121 EX |
| 4,110,594 | 8/1978 | May | 219/121 EX |
| 4,307,282 | 12/1981 | Gappa | 219/121 LJ |

*Primary Examiner*—C. L. Albritton
*Attorney, Agent, or Firm*—Charles L. Lovercheck; Wayne L. Lovercheck; Dale R. Lovercheck

[57] ABSTRACT

A machine for marking idicia on small articles of manufacture by means of a laser. Strips of articles in the form of small relatively flat rectangular plate like members are held together in side by side relation in a common plane in plate like frames. The strips are stacked in magazines. The machine has an indexing turret with eight magazine supporting stations, a diametrically disposed conveyor. The full magazines of unmarked parts are loaded onto the machine at one station at the front of the machine by an operator. The full magazines of unmarked parts are then indexed to an unloading station where the lead frames are automatically unloaded from the magazine onto the conveyor where they are transferred past a laser marking station to an unloading station. The laser marker marks an indicia onto each article and the conveyor moves the lead frames to the loading station, where the stacks are reloaded onto an empty magazine. The operator station, the unloading station and reloading station are each 90 degrees from the other in the example shown. An electric circuit including electric eyes position the articles, stop the machine in case of jams, signal the laser when parts are in position for marking and signal when a magazine has been filled with marked parts.

24 Claims, 13 Drawing Figures

INDEXING LASER MARKER

BACKGROUND OF THE INVENTION

Lasers are important in marking indicia on articles of manufacture. A simple, efficient machine is needed that will remove plate like articles stored in a container or a magazine, mark the articles and return them to the container. A simple and efficient machine to rapidly remove the marked articles that are stacked in containers and return the articles to the containers is disclosed herein.

STATEMENT OF THE INVENTION

The purpose of the mechanism according to the invention is to remove lead frames, which are in this case a strip of electronic components, from a magazine in which they are stacked, mark them and return them to the magazine. The machine for carrying out the method involves an indexing turret type machine having a conveyor arranged diametric of the turret. The turret in this example has eight magazine holders. A laser marker is supported along the conveyor between the ends of the track which marks the articles while they are out of the magazines on the track thereby handling the articles efficiently and automatically. The machine has four work stations and the turret is indexed past them. The operator loads the magazines onto the turret at one work station. At a second station the articles are removed from the loaded magazine and placed on the conveyor. The conveyor brings the parts past a marking position adjacent the conveyor. An unloading position is also provided where the articles are removed from the conveyor and reloaded into the magazine and the reloaded magazine is unloaded from the machine.

OBJECTS OF THE INVENTION

It is an object of the invention to provide an improved laser marking machine.

Another object of the invention is to provide a laser marking machine that is simple in construction, economical to manufacture and simple and efficient to use.

Another object of the invention is to provide a laser marking machine that will remove articles to be marked from a magazine, laser mark the articles and return the articles to the magazine.

With the above and other objects in view, the present invention consists of the combination and arrangement of parts hereinafter more fully described, illustrated in the accompanying drawing and more particularly pointed out in the appended claims, it being understood that changes may be made in the form, size, proportions and minor details of construction without departing from the spirit or sacrificing any of the advantages of the invention.

DETAILED DESCRIPTION OF THE DRAWING

Figure 9:
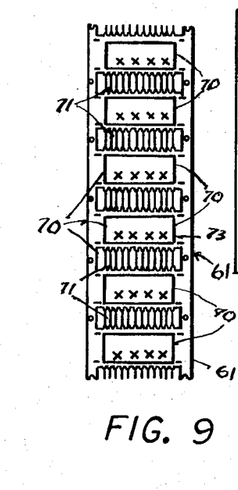
FIG. 9 is a top view of articles supported in a frame to be marked by the machine according to the invention.
Figure 10:
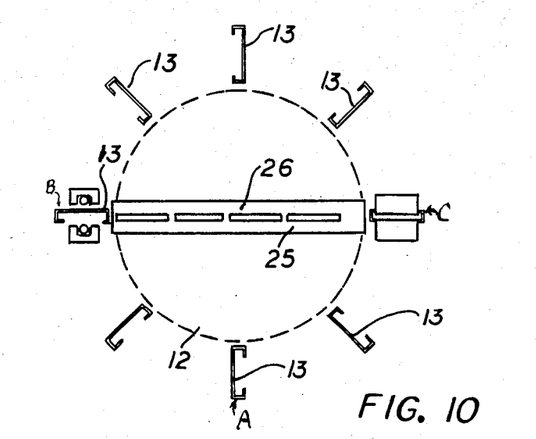
FIG. 10 is a top schematic view of the machine according to the invention.

The purpose of the machine 10 is to mark letters, numerals and other indicia indicated at 73 on small articles like electronic components shown in FIG. 9. These parts may be small plate like electronic parts 70 supported in sheet metal frames 61 with openings 71 punched out of the sheet metal frame 61 between the parts 70 so that lead elements connect the parts together. The frames 61 are stacked one on top of the other in magazines 15-21 and the magazines are supported in the magazine supporting members 13.

Figure 1:
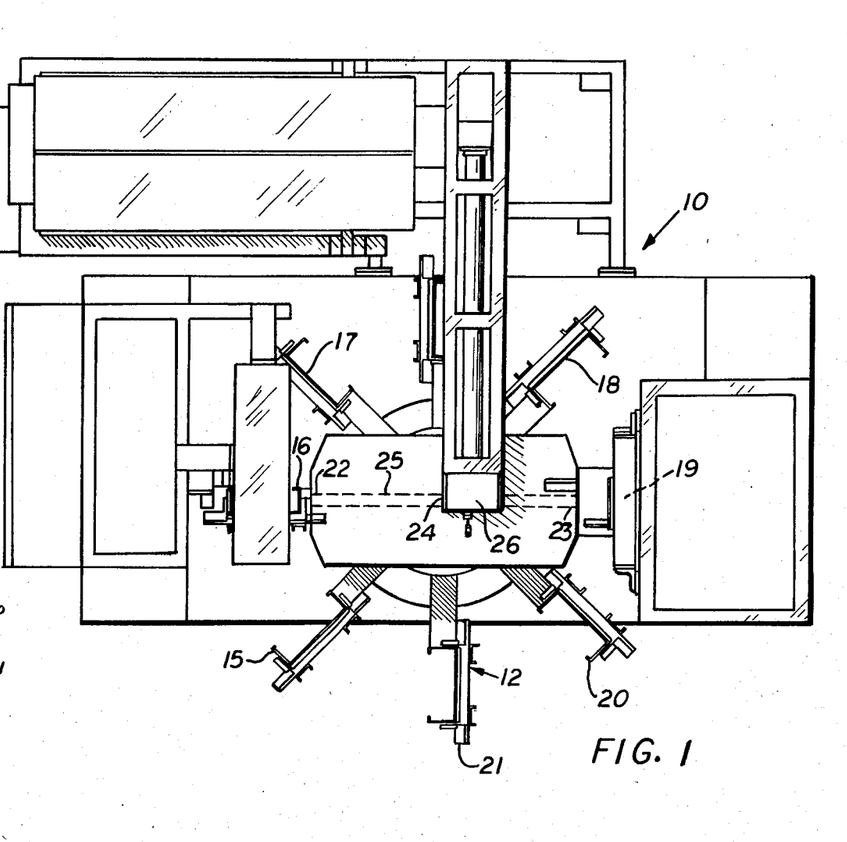
FIG. 1 is a top view of the machine according to the invention.
Figure 2:
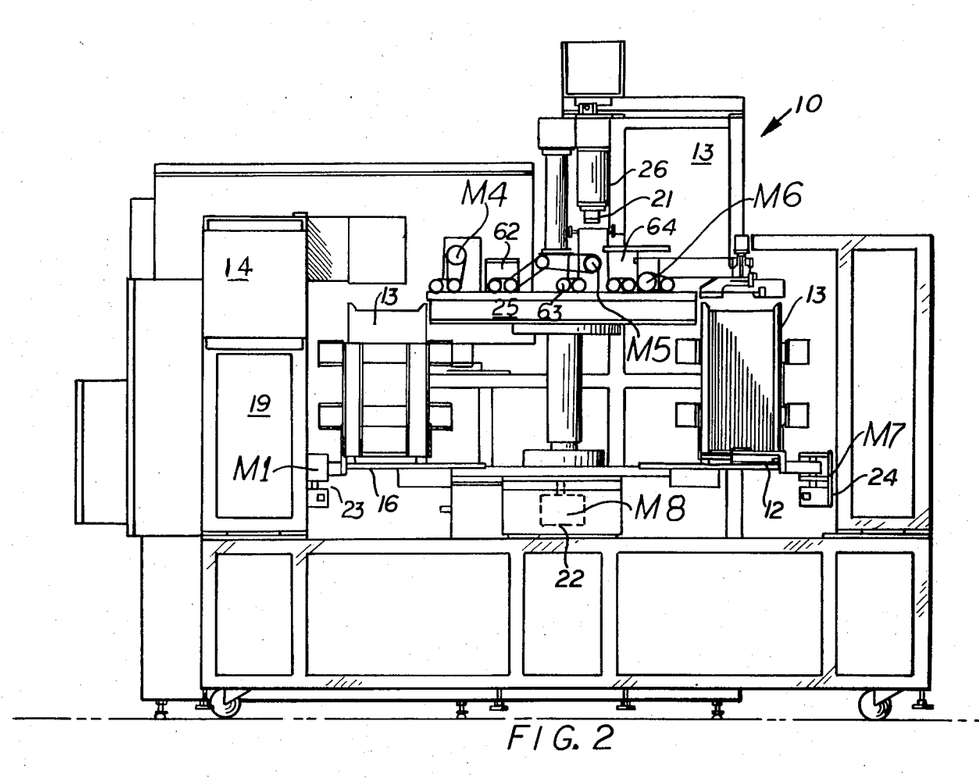
FIG. 2 is a front view of the machine.
Figure 3:
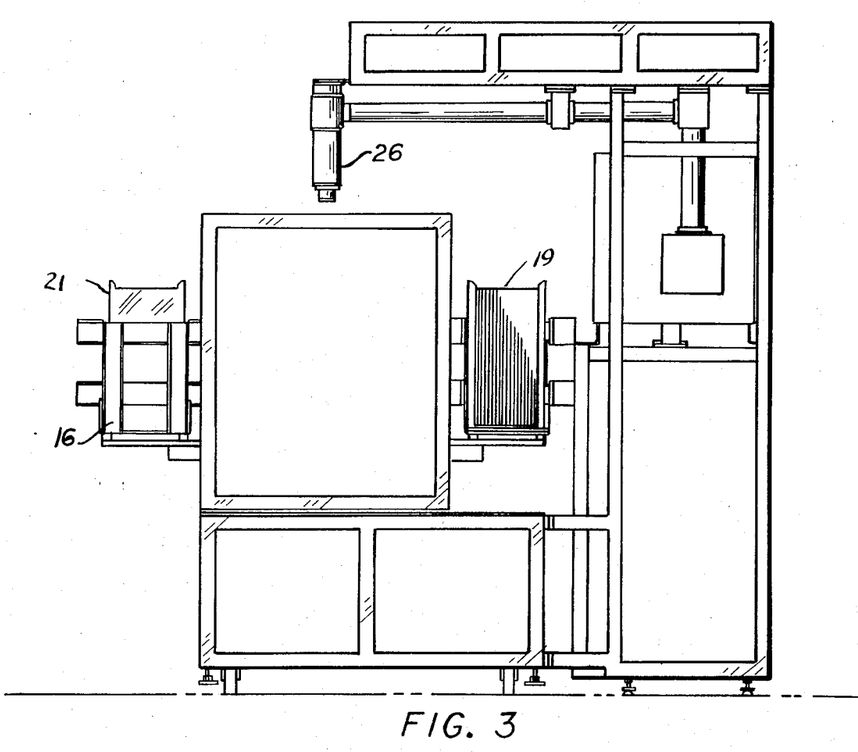
FIG. 3 is a right end view of the machine.
Figure 4:
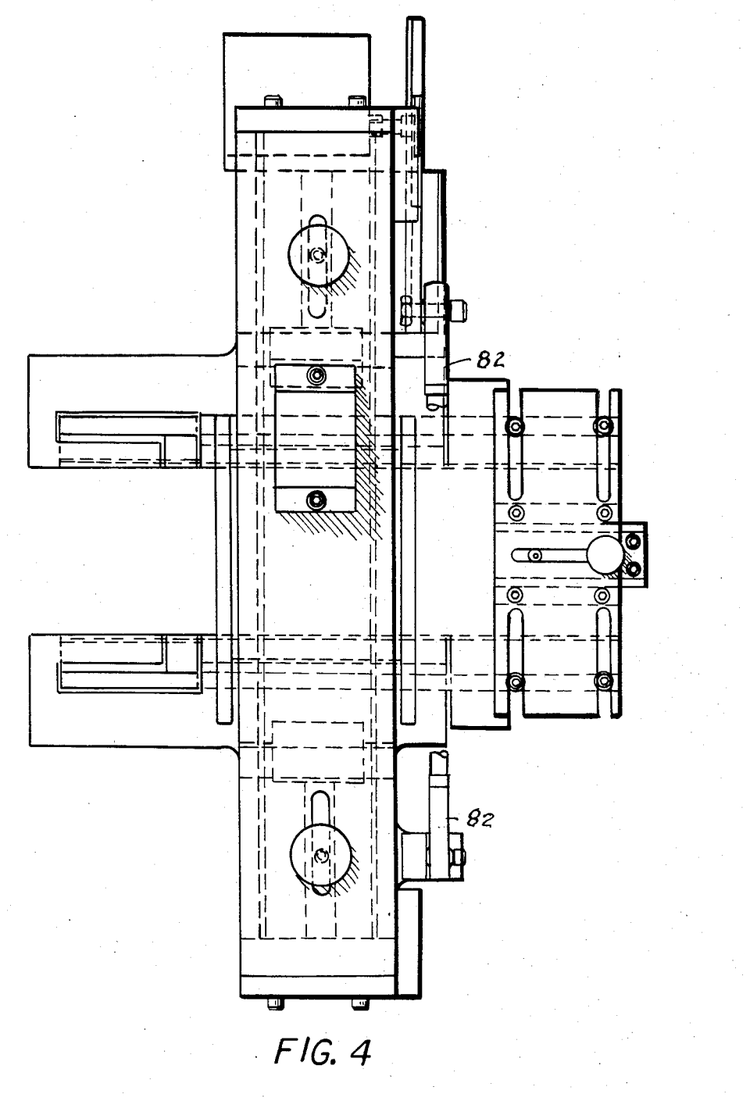
FIG. 4 is a top view of the machine.
Figure 5:
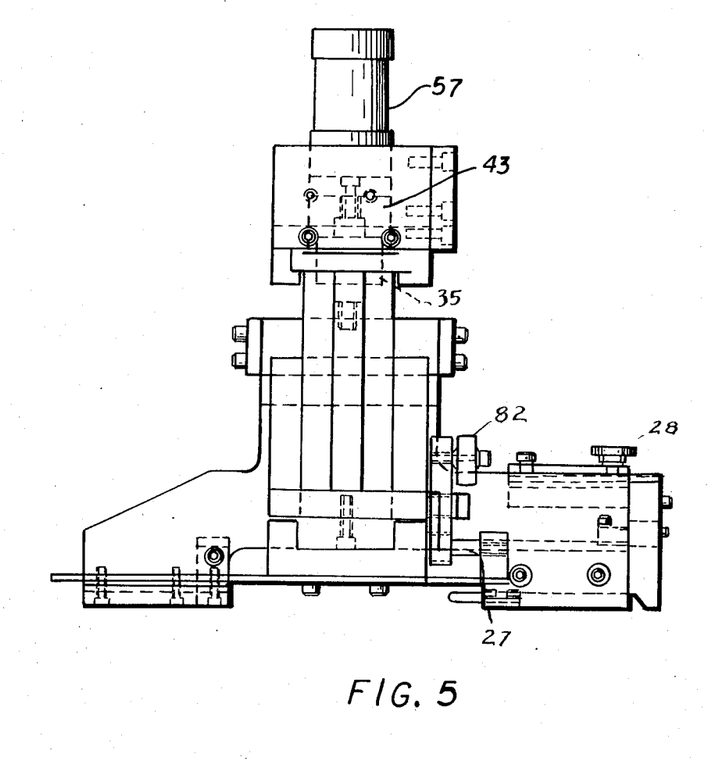
FIG. 5 is a right side of the machine.
Figure 6:
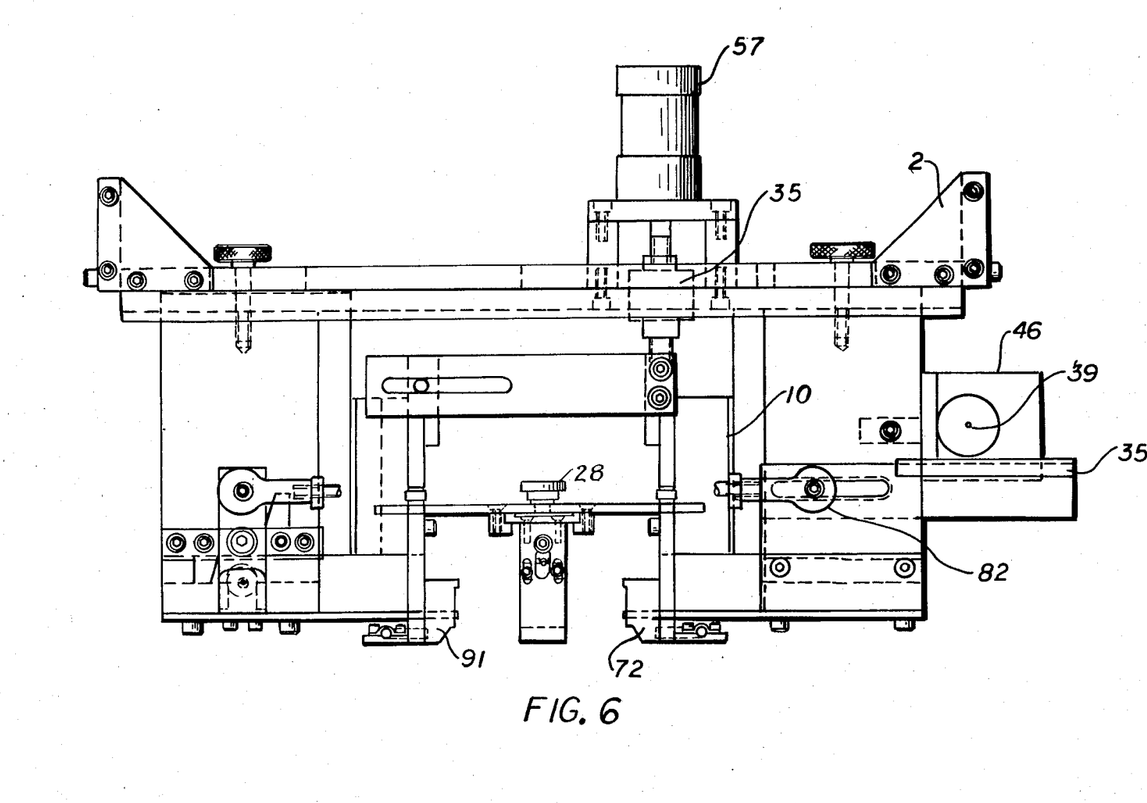
FIG. 6 is a left side view of the magazine loader.
Figure 11:
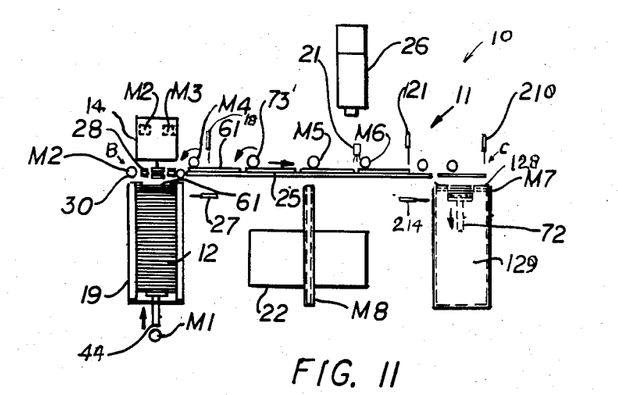
FIG. 11 is a front schematic view of the machine.
Figure 12:
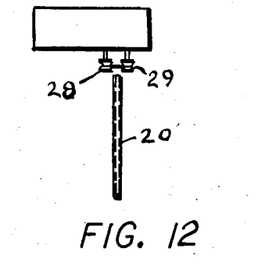
FIG. 12 is an enlarged partial schematic side view of a part of the machine shown in FIG. 1.
Figure 13:
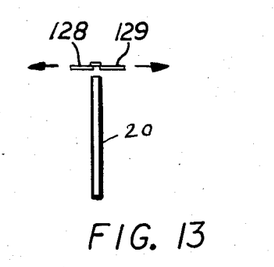
FIG. 13 is an enlarged partial schematic view of a part of the machine shown in FIG. 10.

The various function of the machine are driven by the eight electric motors M1 through M8. Motor M1 is connected to the elevator 44 at the loading position on the pickup and feed mechanism. Motor M2 drives the cam shaft carrying cam 30 on the pickup and feed mechanism. Motor M3 drives the edge feed devices 28 and 29 on the pickup and feed mechanism. Motor M4 drives the low speed section of the conveyor as shown in FIG. 2 and FIG. 11. Motor M5 drives the high speed section of the conveyor as shown in FIG. 2. Motor M6 drives the eject motor. Motor M7 drives the conveyor off load motor shown in FIG. 2. Motor M8 indexes the turret 12 as shown in FIG. 11. The conveyor 25 operates similar to the conveyor disclosed in U.S. Pat. No. 4,375,025.

The machine has a turret 12 with an indexing drive 22 driven by a motor M8. A conveyor 25 is supported on the machine and it extends diametrically of the turret 12 from the pick up and load position B to the unload position C. An elevator 44 is provided at the pickup and load position and an elevator 72 is provided at the unload position. The magazines 20 are generally U-shaped in cross section and open at the top and bottom so that the elevator 44 driven by M1 and the elevator 72 driven by M7 can move the parts up out of the magazines at the pickup station and lower them back into the magazines at the reload station C.

The magazines containing the parts are loaded into the magazine receiving members 13 on the turret by an operator at the position indicated at A and indexed around to the pickup and load position B where the articles are removed one at a time by the pickup and load mechanism and loaded onto the conveyor and transferred by the conveyor under the laser marker 26 to the marking position. After the articles are marked with the desired indicia they are transferred by the conveyor to the reload position C, where the articles are reloaded into the magazines 20'. Empty magazines are carried by the turret between the pickup and load position B and the reload position C.

The frames 61 are presented to machine in magazines 20' at the pickup and load position, lifted by the elevator 44, driven by motor M1. The elevator 44 raises the stacked parts until they are detected by the electric eye 27 and are then picked up by the jaws 28 and 29 which are lowered to extract the part from the magazine by the pickup and load mechanism. The pickup jaws 29 raise the part up to position above the conveyor 25 and edge feed wheels 28 move the part 61 onto the conveyor 25.

A series of drive wheels 73 convey the part horizontally across the conveyor 25. The electric eye 18 prevents jamming by stopping the pickup and feed mechanism 14 which incorporates motors M2 and M3 if the flow of parts is interrupted for any reason.

The electric eye 21 senses each individual article 70 on the strip 62 of parts and signals the laser 26 to fire when the articles is below it, thus producing a mark on the article 70. The electric eye 21 also functions as a jam detector and stops the motors M1, M2, M3, M4, M5 and M6 when no part is sensed by electric eye 18. Electric eye 210 senses that a part is in position above the elevator 72 to be stacked into the empty or part empty receiver magazine 123.

The escapement jaws 128 and 129 driven by motor M7 retract the jaws when the part is over the elevator 72 thereby dropping the part into the magazine. The elevator 72 supports the stack of parts and lowers them into the magazine as signaled by the electric eye 214.

When all of the parts have been removed from a magazine 13 at the feed position B by the pickup and feed mechanism at position B, marked by the lasar 26 and stacked back into a receiver magazine at position C, the indexing mechanism 22 driven by motor M8 advances the turret 12 one position, thus bringing another full magazine of unmarked parts into the pickup and feed position B and advances another empty magazine at the unloader position C to receive articles after marking.

Cam 30 imparts horizontal motion to link 31 which is supported and guided by shaft 32 and bushing 33. Link 34 is in turn connected to gear rack 35. Gear rack 35 is moved horizontally. Links 36 and 37 being directly connected are also displaced horizontally. Link 37 is pinned to bushing block 162 to which jaw 28 is mounted.

When gear rack 35 is displaced horizontally, rotary motion is imparted to spur gear 39. This rotary motion then imparts horizontal motion to gear rack 40 directly below spur gear 39. It is identical in design to rack 35. Links 41 and 42 are directly connected to gear rack 35, displaced horizontally the same distance. Link 42 is connected to bushing block 43. Jaw 29 being directly connected to bushing block 43 is thus displaced horizontally in the opposite direction than jaw 28.

Cam 44 controls the vertical motion of pick up jaws 28 and 29. Cam 44 imparts motion to lever 45 by means cam follower 46. Follower 46 is held against cam 44 by dash pot cylinder 46'. Lever 45 pivots on shaft 47. The motion of lever 45 displaces link 48 and guided by bushing block 49. Shaft 50 being directly connected to link 48 and thus displaced vertically. Pick up jaws 28 and 29 are mounted directly to shafts 50 and are therefore displaced vertically.

Figure 7:
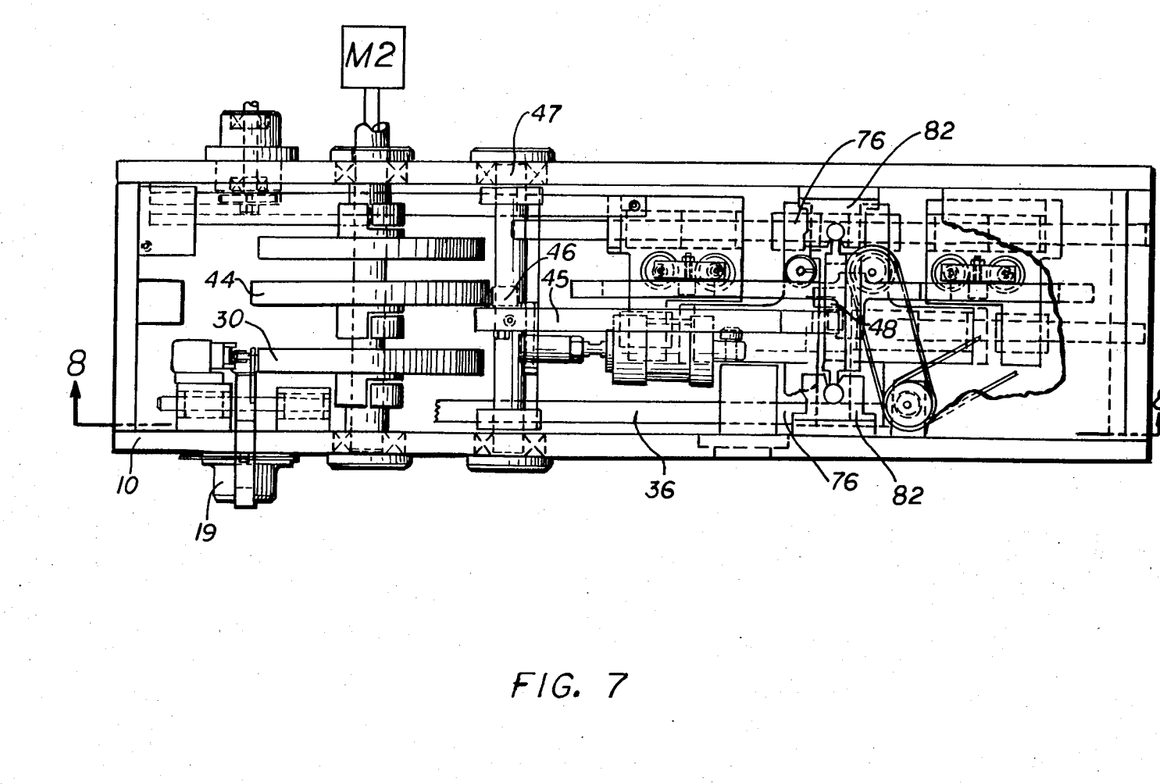
FIG. 7 is a front view of the magazine unloader.
Figure 8:
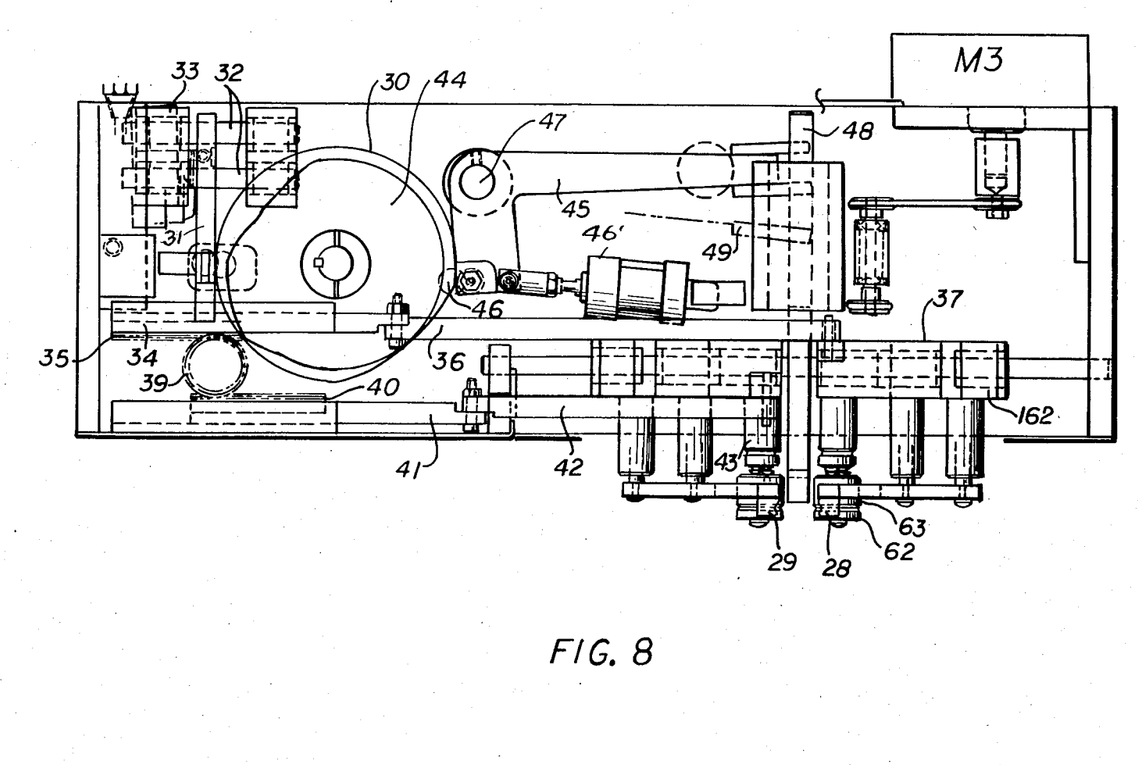
FIG. 8 is an enlarged top view of the unloader mechanism.

There are two drive wheel assemblies which feed the lead frames 61 to the feed track 25. These drive wheel assemblies consist of parts 62, 63 and 64. The two halves of the drive wheel are spring loaded together to pinch the lead frame and provide driving friction. These wheels are powered by electric motor M4. The horizontal motion imparted to the lead frames is controlled by cam 65 and rack and gear linkage identical in design to that which is shown in FIGS. 7 and 8 and displaces the pick up jaws 28 and 29 horizontally.

The foregoing specification sets forth the invention in its preferred, practical forms but the structure shown is capable of modification within a range of equivalents without departing from the invention which is to be understood is broadly novel as is commensurate with the appended claims.

The embodiments of the invention in which an exclusive property or privilege is claimed are defined as follows:

1. A machine for marking indicia on plate like articles of manufacture,
    said machine (10) comprising:
        a frame,
        a rotatable turret on said frame,
        a plurality of spaced magazines supporting means on said turret,
        a conveyor extending diametrically of said turret and having a first end and a second end,
        a feed station on said frame adjacent said first end of said conveyor,
        a loading station and a reloading station on said frame between said feed station and said reloading station for loading magazines onto said turret,
        said reloading station being disposed at said frame adjacent said second end of said conveyor for removing magazines reloaded with marked articles of manufacture,
        laser marking means on said frame between said first end of said conveyor and said second end of said conveyor,
        indexing means on said frame adapted to index said turret moving said magazines supported on said turret successively from said loading station to said feed station and to said reloading station,
        said conveyor being adapted to receive articles from said magazines at said feed station and to move said articles past said laser marking means on said machine at said first end of said conveyor to said reloading station.

2. The machine recited in claim 1 wherein pickup and feed means is provided on said machine at said first end of said conveyor to remove said articles from said magazine at said feed station and to place said articles on said conveyor at said discharge station and to remove said articles from said conveyor and to reload said articles in said magazine at said reloading station.

3. The machine recited in claim 2 wherein said pickup and feed station comprises means to remove said articles from said magazines and to said conveyor.

4. The machine recited in claim 3 wherein said conveyor extends from said feed station to said reloading station whereby said articles are moved past said laser and are marked by said laser and moved from said laser to said reloading station.

5. The machine recited in claim 1 wherein said magazine supporting means are generally rectangular and U-shaped in cross section, open at top and bottom and adapted to receive said magazine.

6. The machine recited in claim 2 wherein said articles are relatively small, flat, electrical components supported in side by side relation in openings in a plate like frame and said frames are stacked one on top of the other and said feed station is adapted to receive magazines loaded with said articles.

7. The machine recited in claim 1 wherein said feed station has means adapted to grasp each said article, lift said article and place said article on said conveyor at said first end thereof.

8. The machine recited in claim 7 wherein said reloading station has magazine reloading means at said second end of said conveyor to move said articles from said conveyor to said magazines at said reloading station.

9. The machine recited in claim 8 wherein said machine has means on said conveyor to move said articles along said conveyor to said laser marking means and means to actuate said laser marking means and means to move said articles to said second end of said conveyor.

10. The machine recited in claim 2 wherein said pickup and feed means is provided on said machine at said loading station comprising an elevator and a first electric eye,
said elevator being adapted to lift said articles in said magazines to bring said articles successively to a position sensed by said electric eye to be grasped by said pickup and feed mechanism.

11. The machine recited in claim 10 wherein said reloading means comprises means to lift said articles from said conveyor and place said articles in a magazine on said turret.

12. The machine recited in claim 11 wherein said reloading means comprises means for moving said articles from said conveyor to a position over a magazine supported on said turret,
elevator means for lowering said articles in said magazine as said articles are moved from said turret.

13. A machine for marking plate like articles by means of a laser comprising,
a machine having means to support magazines containing said articles,
a conveyor on said machine,
a loading position,
an unloading position,
said conveyor extending from said loading position to said unloading position,
laser marking means supported adjacent said conveyor between said loading position and said unloading position for marking articles as they move from said loading position to said unloading position,
means on said machine at said loading position to load said articles onto said conveyor,
means on said machine for moving said articles from said conveyor at said unloading position to unload said articles from said conveyor,
first sensing means adjacent said laser marker means for determining when an article is disposed in position adjacent said laser and for actuating said laser,
second sensing means comprising a first electric eye means adjacent said unloading means for actuating said unloading means.

14. The machine recited in claim 13 wherein said machine is adapted to receive said articles stacked horizontally in magazines comprises a first elevator means for lifting said articles in said magazine, second electric eye means for sensing when said elevator has lifted said article to the proper level and means to move said articles to said conveyor.

15. The machine recited in claim 13 wherein said loading machine comprises pick up and feed means on said machine at said loading position for removing said articles from said magazines and placing said articles on said conveyor.

16. The machine recited in claim 15 wherein said unloading means comprises an elevator to receive said magazines from said conveyor and means to lower said articles in said magazines as the articles are received from said conveyor.

17. The machine recited in claim 16 wherein said elevator comprises means to lower said plate like articles in said magazines to bring each said article to a predetermined level with the top of said conveyor and electric eye means to sense lowered position.

18. The machine recited in claim 13 wherein said machine has a third electric eye to sense jams in said loading means.

19. The machine recited in claim 18 wherein said machine has a fourth electric eye to sense jams at said laser.

20. The machine recited in claim 19 wherein said loading means comprises a first electric eye adapted to sense the position of an article in said magazine at said loading position and to stop said machine if a said article is not present at a predetermined position relative to said conveyor.

21. The machine recited in claim 13 wherein said means for supporting said articles comprises a turret,
said turret has means to support said magazines and to index said magazines generally in a circular path,
said conveyor extending generally diametrically relative to said circular path.

22. The machine recited in claim 19 wherein said machine has a fifth electric eye for determining whether a said article is supported on said conveyor adjacent said reload station.

23. A machine for marking indicia on articles of manufacture stacked in magazines comprising:
a machine having a rotatable turret,
spaced magazine holders on said turret,
means to rotate said turret in a generally circular path,
said machine having a frame,
marking means on said frame,
a conveyor on said frame,
said conveyor extending diametrically of said turret,
said conveyor having a first end and a second end disposed at spaced positions on said turret,
a position on said frame to load said magazines onto said turret at one of said spaced positions,
means to index said turret to bring each said magazine holder in succession to said first end of said conveyor,
first elevator means at said first end of said track for raising said articles in magazines in said magazine supports,
detector means for detecting the position of one of said articles when said article reaches a predetermined level relative to said conveyor,
pick up means to extract said detected article from said magazine,
feed means to engage said detected article and drive said detected article onto said first end of said conveyor,
second sensing means for sensing jams of said articles on said conveyor whereby said conveyor is stopped if a jam occurs,
third sensing means to sense the position of each said article that comes to marking position under said marking means, fourth sensing means to sense the position of each article on said conveyor adjacent said second end of said conveyor, fifth sensing means for sensing the position of each said article over an empty magazine on said turret articles to be stacked in a magazine to be loaded, escapement jaw means to release said articles into said magazine to be loaded, elevator means for supporting said articles to be stacked in said magazine to be loaded and lowering said articles into the magazine to be loaded, a fourth sensing means for determining when each said article has been stacked in said magazine to be loaded, means to index said turret when each said magazine to be loaded is completely filled with said articles and means to actuate said turret to bring another full magazine of unmarked articles into position under said discharge end.

24. A method of marking articles of manufacture stacked in magazines comprising:

providing a machine having a rotatable turret, spaced magazine holders on said turret, a conveyor diametrically disposed across said turret, spaced magazine holders on said turret, laser marking device supported adjacent said conveyor and a control circuit including a plurality of electric eyes comprising the steps:

(a) presenting magazines containing said articles stacked horizontally in said magazine,
(b) indexing said turret to bring one said magazine to said loading position,
(c) lifting said stacked parts in said magazine at said loading station sequentially,
(d) placing said parts sequentially on said conveyor,
(e) moving said parts on said conveyor to said laser marker,
(f) marking said parts,
(g) moving said parts to said discharge position,
(h) lowering said parts from said conveyor into an empty magazine on said turret,
(i) removing said loaded magazine from said turret when said loaded magazine is full.

* * * * *